(12) United States Patent
Balle et al.

(10) Patent No.: US 9,288,921 B2
(45) Date of Patent: Mar. 15, 2016

(54) FIELD DEVICE FOR PROCESS INSTRUMENTATION

(75) Inventors: Patrick Balle, Malsch (DE); Stefan Gross, Dettenheim (DE)

(73) Assignee: Siemens Aktiengesellschaft, Munich (DE)

( * ) Notice: Subject to any disclaimer, the term of this patent is extended or adjusted under 35 U.S.C. 154(b) by 529 days.

(21) Appl. No.: 13/700,926

(22) PCT Filed: Jun. 1, 2011

(86) PCT No.: PCT/EP2011/059050
§ 371 (c)(1),
(2), (4) Date: Apr. 9, 2013

(87) PCT Pub. No.: WO2011/151380
PCT Pub. Date: Dec. 8, 2011

(65) Prior Publication Data
US 2013/0208437 A1   Aug. 15, 2013

(30) Foreign Application Priority Data

Jun. 2, 2010 (DE) .......................... 10 2010 022 530

(51) Int. Cl.
| | |
|---|---|
| H01M 2/34 | (2006.01) |
| H05K 5/02 | (2006.01) |
| G01D 11/24 | (2006.01) |
| G01K 1/08 | (2006.01) |
| H01M 2/10 | (2006.01) |

(52) U.S. Cl.
CPC .............. *H05K 5/0217* (2013.01); *G01D 11/24* (2013.01); *G01K 1/08* (2013.01); *H01M 2/1016* (2013.01); *H01M 2/1055* (2013.01); *H01M 2/34* (2013.01); *G01K 2215/00* (2013.01); *H01M 2200/00* (2013.01)

(58) Field of Classification Search
CPC ........................... H01M 2/34; H01M 2200/00
See application file for complete search history.

(56) References Cited

U.S. PATENT DOCUMENTS

| | | | | |
|---|---|---|---|---|
| 4,913,984 | A | * | 4/1990 | Shimizu .......................... 429/97 |
| 4,977,042 | A | * | 12/1990 | Chiyajo et al. .................. 429/49 |
| 5,097,384 | A | * | 3/1992 | Sunano ..................... 361/679.31 |
| 6,795,319 | B2 | | 9/2004 | Preston et al. |
| 2007/0201192 | A1 | | 8/2007 | McGuire et al. |

FOREIGN PATENT DOCUMENTS

| | | |
|---|---|---|
| CN | 101427400 | 5/2009 |
| DE | 4323891 | 1/1995 |
| EP | 0565217 | 10/1993 |
| EP | 1 989 746 B1 | 1/2011 |
| JP | 59058756 | 4/1984 |
| WO | WO 2007/098222 | 8/2007 |

\* cited by examiner

*Primary Examiner* — Ramon M Barrera
(74) *Attorney, Agent, or Firm* — Cozen O'Connor

(57) ABSTRACT

A field device for process instrumentation, i.e., a measuring transducer, actuator, or mobile operating device, which is suitable for use in explosion-prone areas. The field device is battery-driven and has at least one battery for supplying an electronic unit with energy. A battery compartment is constructed such that standard batteries can be inserted without the risk of spark formation. A corresponding design of a supply circuit ensures that the circuit can only be closed, for example, when closing the battery compartment once a lid is closed to the extent that the battery compartment meets the requirements for use in explosion-prone areas. The invention has the advantage that comparatively inexpensive standard batteries can be used and that the ignition protection is maintained during the entire battery switching process.

5 Claims, 2 Drawing Sheets

FIELD DEVICE FOR PROCESS INSTRUMENTATION

CROSS-REFERENCE TO RELATED APPLICATIONS

This is a U.S. national stage of application No. PCT/EP2011/059050 filed 1 Jun. 2011. Priority is claimed on German Application No. 10 2010 022 530.4 filed 2 Jun. 2010, the content of which is incorporated herein by reference in its entirety.

BACKGROUND OF THE INVENTION

1. Field of the Invention

The invention relates to a field device for process instrumentation and, more particularly to, a measuring transducer, an actuator or a mobile operating device, which is suitable for use in areas subject to explosion hazards.

2. Description of the Related Art

Versatile field devices for process instrumentation are used to control processes in process installations. Measuring transducers are used to record process variables, such as temperature, pressure, flow rate, filling level, density or gas concentration of a medium. The process sequence can be influenced by actuators based on recorded process variables, for example, corresponding to a strategy that is predetermined by a control station, or under the control of an automation device, such as a programmable logic controller. A control valve, a heater or a pump may be mentioned as examples of actuators. So that a control station or an automation device can communicate with the process peripherals, i.e., with the measuring transducers or the actuators or further devices arranged close to the process, they have hitherto usually been connected to one another via a wired communication network. Via this network, the control station or automation device receives data, for example, from the measuring transducers and outputs control information to the actuators. The associated wiring complexity can be greatly reduced if the wired communication network is replaced with a radio-based network. Field devices, for example, measuring transducers, actuators, transport vehicles or operating devices, are provided with a radio interface for this purpose so that they can participate in the wireless communication with the control station or the automation device via access points or switches, for example. If an electronic unit of the field device is supplied with the energy required for its operation by a battery, the field device can be completely operated without a cable connection.

Such a field device is known, for example, from U.S. Pat. No. 6,795,319 B2. So that the field device can be used in areas subject to explosion hazards, its electronic unit is situated in an encapsulated housing and an energy supply module is designed to be intrinsically safe to avoid sparking. In order to meet the requirements of the ignition protection type "intrinsic safety", a battery used in the energy supply module is encapsulated and therefore disadvantageously cannot be replaced if necessary. In contrast, replacing the complete energy supply module is associated with a comparatively large amount of effort.

SUMMARY OF THE INVENTION

It is therefore an object of the invention to provide a field device for process instrumentation which is suitable for use in areas subject to explosion hazards and which makes it possible to change a battery in a particularly simple manner.

This and other objects and advantages are achieved in accordance with the invention by a field device in which at least one battery comprises a replaceable standard battery and is arranged in a battery compartment which is disposed in a housing part, the housing part to be opened and/or a cover includes a battery chamber for accommodating the at least one battery in a correct position, a circuit for supplying the electronic unit with the auxiliary energy provided by the at least one battery is configured such that, when closing the battery compartment, the circuit is closed only when the housing part has already been closed by the cover such that the battery compartment meets a requirement for use in areas subject to explosion hazards. In addition, when opening the battery compartment, the circuit has already been opened before the housing part has been opened by the cover such that the battery compartment no longer meets the requirement for use in areas subject to explosion hazards.

The invention is based on the knowledge that replaceable standard batteries can be used in battery-operated field devices, which are intended for use in areas subject to explosion hazards, only when the configuration of the battery compartment ensures that ignition protection remains guaranteed during the entire operation of changing the battery, and it is thus ensured that the requirements for use in areas subject to explosion hazards are met at all times. Standard batteries are, for example, primary cells, which can only be discharged once and cannot be recharged, in sizes AAA, AA, C or D standardized by the ANSI, which are often referred to as microcells, mignon cells, baby cells and mono cells. Such primary cells are readily available on the market and can be obtained at comparatively favorable costs. Rechargeable batteries in commercially available types, for example NiCd (nickel cadmium), NiMH (nickel metal hydride) or Li ion (lithium ion) rechargeable batteries, are likewise considered to be standard batteries. In comparison with an energy supply module in which the battery is encapsulated and which possibly has a specially sealed contact plug, with the result that a type of closed chamber is produced in the region of the plug contacts, the battery can now be changed in a very simple manner and with comparatively low costs. In addition, the use of an energy supply module would make environmentally friendly disposal more difficult because the module is composed of different materials, while only the used battery must be disposed of in the case of the field device in accordance with the invention.

The configuration of the battery chamber into which the battery can be inserted only in the correct position avoids battery contacts being able to be unintentionally short-circuited when handling the battery. A suitable design of a circuit for supplying the electronic unit with the auxiliary energy provided by the battery advantageously ensures that, whenever the battery compartment would no longer meet the requirements for use in areas subject to explosion hazards on account of its opening state, the circuit has already been opened and sparking is thus reliably avoided.

In one particularly advantageous embodiment, the housing part of the battery compartment can be closed with the cover by a screw closure, and an electrical contact in the supply circuit establishes a connection only when the screw closure has been screwed in to such an extent that the requirements for use in areas subject to explosion hazards have been met on account of the special property of the screw closure whereby the latter has the function of an adequate ignition barrier or flame arrester. This may be achieved by suitable dimensioning of the thread, for example, by suitably stipulating the gap width remaining in the thread, the material or the thread height. The thread is preferably designed such that the battery compartment can already be considered to be a pressure-resistant encapsulation when the screw closure is screwed in to such an extent.

If the electrical contact is in the form of a contact lug which, when closing the screw closure, automatically makes contact with a mating contact for closing the supply circuit and releases the mating contact again at the start of an opening operation of the screw closure, this has the advantage that no additional switch is needed to open and close the supply circuit when replacing the battery and the production costs of the battery compartment are thus reduced.

A particularly simple implementation of the battery compartment is advantageously achieved if the battery is substantially cylindrical and a respective battery contact is situated on the base surfaces of the cylinder. A first battery contact of the battery is then inserted first into the battery chamber when the cover is open. A cover that is substantially cup-shaped, the cover thread for implementing the screw closure being situated in the region of the edge of the cup, is provided, on its inside of the cup base, with an electrically conductive element, i.e., a metal plate, for making contact with the second battery contact. The electrically conductive element simultaneously forms the mating contact for the contact lug. Copper, for example, is suitable as the material.

In another particularly advantageous embodiment, a respective spring in the battery chamber and on the contact lug is used to press the battery or contact lug against the electrically conductive element in the closed state of the battery compartment. Permanent and good contact is achieved thereby.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention as well as refinements and advantages are explained in more detail below using the drawings which illustrate an exemplary embodiment of the invention and in which.

DETAILED DESCRIPTION OF THE PREFERRED EMBODIMENTS

In the figures, identical parts are provided with identical reference symbols.

Figure 1:
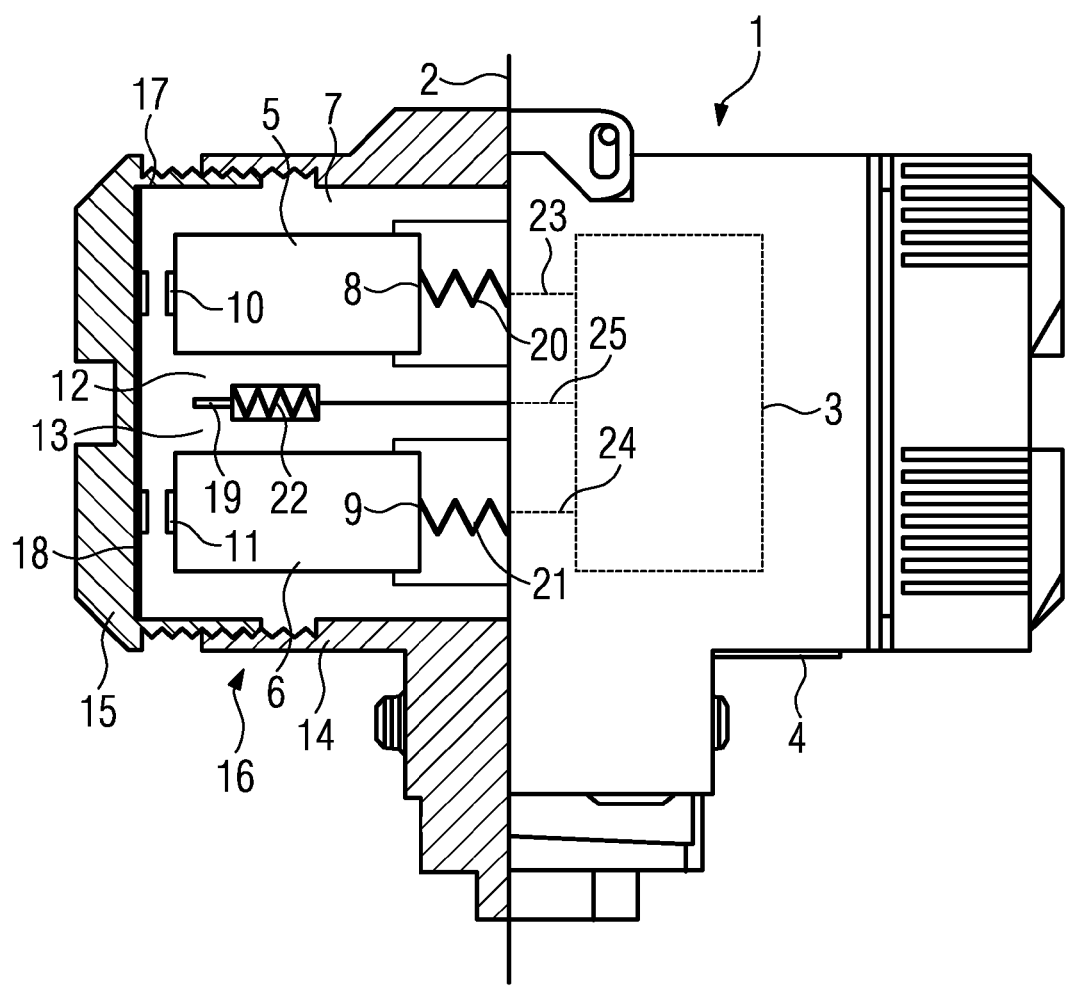
FIG. 1 shows a field device having a half-opened battery compartment in accordance with the invention.
Figure 2:
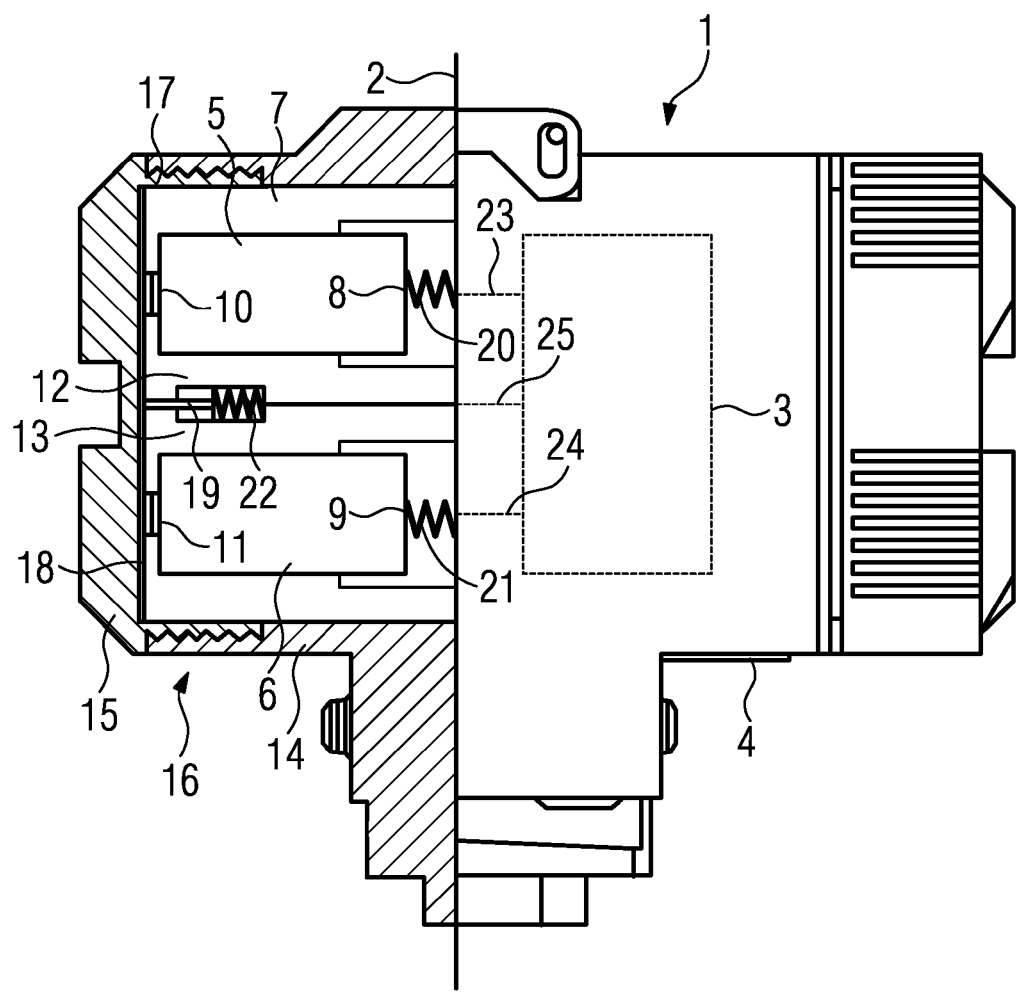
FIG. 2 shows the field device of FIG. 1 with a closed battery compartment.

As an example of a field device for process instrumentation which is illustrated for use in areas subject to explosion hazards, FIGS. 1 and 2 show a measuring transducer 1. The right-hand half of each of FIGS. 1 and 2, i.e., the right of a line 2, illustrates an external view of the measuring transducer 1, and the respective left-hand half illustrates a sectional diagram of the respective part of the measuring transducer 1. An electronic unit 3 is situated inside a housing 4 of the measuring transducer 1. The electronic unit 3 has been depicted with dashed lines in order to illustrate that it would actually not be visible in the external view on account of its arrangement inside the housing 4.

The measuring transducer 1 is battery-operated. The auxiliary energy needed to operate the electronic unit 3 is supplied by two batteries 5 and 6 that are situated inside a battery compartment 7. The battery compartment 7 is situated in a housing part 14 which can be closed with a cover 15 by a screw closure 16. The cover 15 is substantially cup-shaped, a thread 17 of the cover 15 for implementing the screw closure 16 being situated on the outside of the edge of the cup. The two batteries 5 and 6 are in the form of replaceable standard batteries of the size D. The batteries 5 and 6 are substantially cylindrical and have first contacts 8 and 9, here the negative terminals, with which they are first inserted into the battery compartment 7. Second battery contacts 10 and 11, the positive terminals of the batteries 5 and 6, are situated on the respective opposite base surface of the cylinder. Battery chambers 12 and 13 that are used to accommodate the batteries 5 and 6 in the correct position are such that, on account of their dimensioning and the materials used, short-circuiting of the contacts 8 and 10 or of the contacts 9 and 11 is impossible even with unskilled handling of the batteries 5 and 6. A copper plate 18 which, in the closed state of the battery compartment 7, is used to make contact with the contacts 10 and 11 of the batteries 5 and 6 and to make contact with a contact lug 19 arranged in the center of the battery compartment 7, is arranged on the inside of the base of the cup of the cover 15. In the closed state of the battery compartment 7, which is illustrated in FIG. 2, the battery 5, the battery 6 and the contact lug 19 are pressed against the plate 18 using springs 20, 21 and 22. The springs 20, 21 and 22 are used for tolerance compensation and to ensure permanent and good contact with the plate 18. The plate 18, the contact lug 19, the springs 20, 21 and 22 and the supply lines 23, 24 and 25 form a circuit for supplying the electronic unit 3 with the auxiliary energy which is provided by the batteries 5 and 6 and is needed to operate the electronic unit 3.

If the screw closure 16, as illustrated in FIG. 2, has been screwed in completely, the supply circuit is also closed and the supply for the electronic unit 3 is thus ensured. An embodiment of the battery compartment 7 as a pressure-resistant encapsulation ensures that the requirements for use of the field device 1 in areas subject to explosion hazards are met. These requirements are even met when the screw closure 16, as illustrated in FIG. 1, has been screwed in only halfway. This is because the gap remaining in the screw closure 16 is an ignition barrier or flame arrester which, in the event of a gas being ignited inside the battery compartment 7, prevents the flame from being transferred out of the field device 1 through the thread gap. In this case, use is made of the knowledge that flames lose energy as they pass through the narrow thread gap and are no longer reactive and can thus be extinguished. In this case, the flames are extinguished by intimate contact between the flame and the cooling walls of the thread gap and by a pressure drop. In order to achieve a path that is resistant to ignition flashovers, the thread gap should be sufficiently small and the height of the screw closure 16 remaining in engagement when opening the supply circuit should be sufficiently large. The supply circuit, the height of the screw closure 16 and the geometrical dimensions of the battery compartment 7 containing the batteries 5 and 6 are thus matched to one another such that, when closing the battery compartment 7, the supply circuit is closed only when the housing part 14 has already been closed by the cover 15 to such an extent that the battery compartment 7 meets the requirements for use in areas subject to explosion hazards. At the same time, the suitable configuration means that, when opening the battery compartment 7, the supply circuit has already been opened before the housing part 14 has already been opened by the cover 15 to such an extent that the battery compartment 7 no longer meets the requirements for use in areas subject to explosion hazards. It is thus ensured in a particularly simple manner that the ignition protection remains during the entire operation of changing the battery.

In one modification of the exemplary embodiment described, the screw closure could be replaced with a bayonet closure. In this case, a suitable design of the supply circuit may likewise achieve the function whereby the circuit can be opened or closed only in those states of the closure in which the battery compartment meets the requirements for use in areas subject to explosion hazards on account of its design. For example, the circuit could be closed by a rotational movement shortly before the completely closed state of the bayonet closure is reached.

While there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A field device for process instrumentation which is configured for use in areas subject to explosion hazards, comprising:
    a housing of the field device;
    an electronic unit arranged in the housing of the field device;
    at least one battery for supplying the electronic unit with auxiliary energy required for its operation;
    a housing part including a cover which is removable to replace the at least one battery; and
    a battery compartment disposed in the housing part;
    wherein the at least one battery comprises a replaceable standard battery and is arranged in the battery compartment disposed in the housing part;
    wherein at least one of the housing part to be opened and the cover includes a battery chamber for accommodating the at least one battery in a correct position;
    wherein a circuit for supplying the electronic unit with the auxiliary energy provided by the at least one battery is configured such that, when closing the battery compartment, the circuit is closed only when the housing part has already been closed by the cover such that the battery compartment meets a requirement for use in areas subject to explosion hazards;
    wherein, when opening the battery compartment, the circuit has already been opened before the housing part has been opened by the cover such that the battery compartment no longer meets the requirement for use in areas subject to explosion hazards; and
    wherein the housing part is closable with the cover by a screw closure, and wherein at least one electrical contact in the supply circuit is closable only when the screw closure has been screwed in such that the requirements for use in areas subject to explosion hazards have been met on account of its property as an ignition barrier or flame arrester.

2. The field device as claimed in claim 1, wherein the electrical contact comprises a contact lug which, when closing the screw closure, automatically contacts a mating contact to close the supply circuit and automatically re-releases the mating contact at a start of an opening operation of the screw closure.

3. The field device as claimed in claim 2, wherein the at least one battery is substantially cylindrical, a respective battery contact being situated on base surfaces of the cylinder;
    wherein a first battery contact of the at least one battery is insertable first into the battery chamber when the cover is open;
    wherein the cover is substantially cup-shaped, a cover thread for implementing the screw closure being situated in a region of an edge of the substantially cup-shaped cover;
    wherein the substantially cup-shaped cover is provided, on an inside of a base of the substantially cup-shaped cover, with an electrically conductive element for making contact with a second battery contact; and
    wherein the electrically conductive element forms a mating contact for a contact lug of the at least one electrical contact.

4. The field device as claimed in claim 3, wherein the battery chamber and the contact lug are each provided with a spring for pressing the at least one battery or contact lug against the electrically conductive element in a closed state of the battery compartment.

5. The field device as claimed in claim 1, wherein the field device comprises one of a measuring transducer, an actuator and a mobile operating device.

\* \* \* \* \*